US008831318B2

(12) United States Patent
Sharif et al.

(10) Patent No.: US 8,831,318 B2
(45) Date of Patent: Sep. 9, 2014

(54) AUTO-CALIBRATING PARALLEL MRI TECHNIQUE WITH DISTORTION-OPTIMAL IMAGE RECONSTRUCTION

(75) Inventors: Behzad Sharif, Los Angeles, CA (US); Yoem Bresler, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 319 days.

(21) Appl. No.: 12/827,588

(22) Filed: Jun. 30, 2010

(65) Prior Publication Data

US 2011/0286648 A1   Nov. 24, 2011

Related U.S. Application Data

(60) Provisional application No. 61/223,240, filed on Jul. 6, 2009.

(51) Int. Cl.
*G06K 9/00* (2006.01)
*A61B 5/055* (2006.01)
*G01R 33/561* (2006.01)

(52) U.S. Cl.
CPC ................... *G01R 33/5611* (2013.01)
USPC ............................... 382/131; 705/3

(58) Field of Classification Search
CPC .................... G01R 33/5611; G01R 33/34076; G01R 33/341; G01R 33/345
USPC .......................................................... 382/131
See application file for complete search history.

(56) References Cited

U.S. PATENT DOCUMENTS

| | | | | |
|---|---|---|---|---|
| 5,929,628 A | * | 7/1999 | Becker et al. | 324/750.02 |
| 2008/0097764 A1 | * | 4/2008 | Grill et al. | 704/500 |
| 2008/0129298 A1 | * | 6/2008 | Vaughan et al. | 324/322 |
| 2008/0154115 A1 | * | 6/2008 | Fuderer et al. | 600/410 |

* cited by examiner

*Primary Examiner* — Hiep V Nguyen
(74) *Attorney, Agent, or Firm* — Quarles & Brady, LLP

(57) ABSTRACT

The invention is a new computational method for the formation of magnetic resonance (MR) images. The method utilizes the data acquired by the multiple receiver channels available as parallel imaging hardware on standard MRI scanners to: (i) automatically identify a set of multi-input multi-output (MIMO) systems (e.g., MIMO filter banks) that act as interpolation kernels for acquired MR data sets (that can be sub-sampled with respect to the Nyquist criterion) without requiring a separate calibration scan; and (ii) use the identified MIMO systems to synthesize MR data sets that can in turn be used to produce high quality images, thereby enabling high quality imaging with fewer data samples than current methods (or equivalently provide higher image quality with the same number of data samples). A unique feature of the present invention is its ability to account for aliasing effects and minimize the associated image distortion by optimally adapting the said MIMO interpolation (image reconstruction) kernels. This ability to image with a reduced number of data samples accelerates the imaging process; hence, overcoming the main shortcoming of MRI compared to other medical imaging modalities.

27 Claims, 10 Drawing Sheets

> Goal: Perfect Interpolation (PI): $\hat{W}_i(z) = W_i(z) \quad i=1,\ldots,N$

AUTO-CALIBRATING PARALLEL MRI TECHNIQUE WITH DISTORTION-OPTIMAL IMAGE RECONSTRUCTION

CROSS-REFERENCE TO RELATED APPLICATIONS

This application claims the benefit of priority from U.S. Provisional Application Ser. No. 61/223,240 filed Jul. 6, 2009, which is herein incorporated by reference in its entirety.

BACKGROUND OF THE INVENTION

The field of the invention is magnetic resonance imaging (MRI) methods and systems. The invention is a new computational method for the formation of MR images using the data acquired by the multiple receiver channels available on standard MRI.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant of the nucleus). Nuclei which exhibit this phenomena are referred to herein as "spins".

When a substance such as human tissue is subjected to a uniform, static magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal that is emitted by the excited spins after the excitation signal $B_1$ is terminated. There are a wide variety of measurement sequences in which this nuclear magnetic resonance ("NMR") phenomenon is exploited.

When utilizing NMR to produce images, a technique is employed to obtain NMR signals from specific locations in the subject. Typically, the region that is to be imaged (region of interest) is scanned by a sequence of NMR measurement cycles which vary according to the particular localization method being used. The resulting set of received NMR signals, or "views", are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) that have the same direction as the polarizing field B0, but which have a gradient along the respective x, y and z axes. By controlling the strength of these gradients during each NMR cycle, the NMR signal can be spatially "encoded", i.e., the spatial distribution of spin excitation can be controlled and the location of the resulting NMR signals can be identified.

The present invention will be described with reference to a variant of the Fourier transform (FT) imaging technique, which is frequently referred to as "spin-warp". The spin-warp technique is discussed in an article entitled "Spin Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR spin-echo signals to phase-encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse Gy is incremented ($\Delta G_y$) in the sequence of views that are acquired during the scan to produce a set of NMR data from which an entire image can be reconstructed.

General fast imaging methods in MRI attempt to acquire the maximum amount of MR data in the given interval of time (for reference, see M. S. Cohen and R. M. Weisskoff, "Ultra-fast imaging," Magn Reson Imaging, vol. 9, pp. 1-37, 1991). To gain acceleration in the imaging process, fast imaging methods typically rely on advanced MR hardware such as fast gradients, multiple RF receiver channels (coils), and corresponding imaging schemes such as fast pulse-sequences and parallel MRI schemes (described below).

Fast pulse sequences and the hardware requirements to support them are well known and widely used (for reference, see M. Bernstein, K. King and X. Zhou, "Handbook of MRI Pulse Sequences." Elsevier, 2004, pp. 1040). However, these methods are limited owing to physiological limitations, e.g., peripheral nerve stimulation caused by fast switching gradient pulses. Furthermore, parallel imaging techniques such as the present invention can take advantage of any such methods and hence enjoys their benefits.

A recent technique used to shorten scan time is referred to generally as "parallel magnetic resonance" (PMR) imaging and is sometimes referred to as "partially parallel acquisition" or "partial parallel MRI". Using MR scanner equipped with multiple receiver channels and a set of RF receiver coils (also referred to as phased-array coils), PMR techniques use spatial information from the array of RF detector coils to substitute for the encoding which would otherwise have to be obtained in a sequential fashion using field gradients and RF pulses. In conjunction with recently developed data acquisition technologies, parallel MRI (PMRI) can significantly accelerate the data acquisition without increasing gradient switching rates or RF power deposition. Several variations of PMRI schemes have been reviewed in the following two articles: M. Blaimer et al., "SMASH, SENSE, PILS, GRAPPA: how to choose the optimal method," Top. Magn. Reson. Imaging, vol. 15, pp. 223-236, August 2004; and A. C. S. Brau et al., "Comparison of reconstruction accuracy and efficiency among autocalibrating data-driven parallel imaging methods," Magnetic Resonance in Medicine, vol. 59, pp. 382-395, 2008.

Three such parallel imaging techniques that have recently been developed and applied to in vivo imaging are SENSE (Sensitivity Encoding; Pruessmann et al., Magnetic Resonance in Medicine Vol. 42, p.952-962, 1999), SMASH (simultaneous acquisition of spatial harmonics; disclosed in U.S. Pat. No. 5,910,728 issued on Jun. 8, 1999) and GRAPPA (generalized autocalibrating partially parallel acquisitions; M. A. Griswold et al., Magn. Reson. Med., vol. 47, pp. 1202-1210, June 2002; disclosed in U.S. Pat. No. 6,841,998 issued on Jan. 11, 2005). These techniques include the parallel use of a plurality of separate receiving coils, with each coil having a different sensitivity profile. The combination of the separate NMR signals produced by these coils enables a reduction of the acquisition time required for an image (in comparison with conventional Fourier image reconstruction) by a factor which in the most favorable case equals the number of the receiving coils used as explained by Pruessmann et al., *Magnetic Resonance in Medicine* Vol. 42, p. 952-962, 1999. For pulse sequences that execute a rectilinear trajectory in k-space, parallel imaging techniques usually reduce the number of phase encoding steps in order to reduce imaging time, and then use the coil sensitivity information to make up for the loss of spatial information.

SUMMARY OF THE INVENTION

The present invention is a new process and computational method for MRI. It improves upon existing parallel MRI methods, which are used almost ubiquitously in current MRI scans. One objective of the invention is to reduce the scan time and complexity of MRI, which is inherently a slow and complicated imaging modality. Another objective is to produce better MR images at the same or shorter scan times in MRI scanners equipped with a parallel receiver coil array. Specifically, the goal of the invention is to produce MR images with higher quality (lower distortion, lower image artifacts, and low noise).

One embodiment of the invention utilizes the data acquired by the multiple receiver channels available as parallel imaging hardware on standard MRI scanners to: (1) automatically identify a multi-input multi-output (MIMO) system of filters (e.g., shift-invariant finite impulse response (FIR) filters) that acts as an interpolation kernel for acquired MR data sets (which can be subsampled with respect to the Nyquist criterion) without requiring a separate calibration scan; and (2) use the identified MIMO system to synthesize MR data sets that correspond to (or can be used to produce) high quality images, thereby enabling high quality imaging with fewer data samples than current methods (or equivalently provide higher image quality with the same number of data samples). A unique feature of the present invention is its ability to account for aliasing effects and minimize the associated image distortion by optimally adapting the said MIMO interpolation (image reconstruction) kernel.

The presented method will provide the following benefits:
(i) Improve the quality of images obtainable by MR scanners in current parallel imaging applications by reducing image artifacts, specifically the aliasing distortion commonly present in the state-of-the-art auto-calibrating techniques such as GRAPPA;
(ii) Extend the set of clinical applications for parallel MRI by reducing the required total scan time. These factors will ultimately enable real-time 3D imaging with high resolutions that are currently considered infeasible or undesirable (due to very long scan times) because of patient discomfort or the high cost associated with such long and complicated MRI scans;
(iii) Improving robustness to subject motion by eliminating the need for pre-calibration (required in the method of SENSE) while accelerating the imaging process. This is especially significant in real-time imaging scenarios such as the growing interventional imaging area (used for guidance of surgical procedures in real-time).

GENERAL DESCRIPTION OF THE INVENTION

Figure 1:
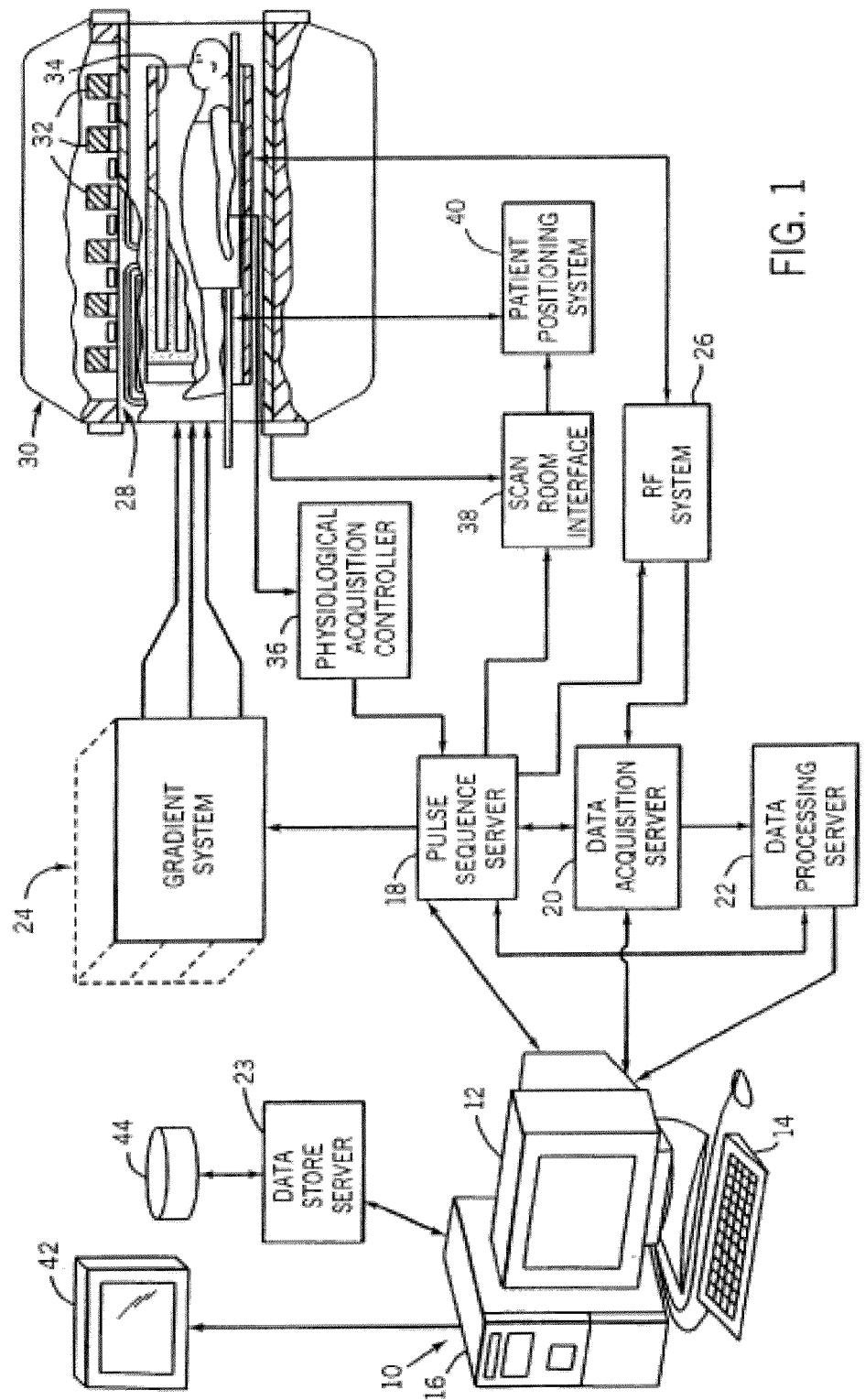
FIG. 1 is a block diagram of an MRI system that employs the present invention.

Parallel imaging hardware with phased-array (multi-channel) receiver coils is available in almost all current MRI scanners. However, most parallel imaging schemes require additional data (calibration scan) in order to identify the reception characteristics of the receiver coil array—the result of which is used in the image reconstruction process. In the present invention, this is achieved by a novel computational scheme without the need for a separate acquisition scan, which is typically referred to as the calibration scan. The main advantage of the present invention is that it provides two distinct features both highly desirable in parallel imaging:

1. Auto-calibration: Providing high imaging accelerations without the need for additional receiver calibration scan;
2. Artifact-free Imaging: Achieving (approximate) distortion-free imaging for optimal image quality, even with high imaging-acceleration factors.

Parallel MRI techniques that are routinely used in current MRI protocols and are implemented on clinical and research MRI scanners include the method of SENSE ("SENSitivity Encoding") and the method of GRAPPA ("GeneRalized Autocalibrating Partially Parallel Acquisitions"). (References for each method were cited above).

Here, we list the major disadvantages associated with each method:

I. The method of SENSE requires a separate calibration scan (data acquisition), typically performed prior to the accelerated scan (in which the diagnostic data is acquired), to identify the characteristics of the receiver coils. Such a scan adds to the total scan time and complexity of the MRI scheme. It also assumes no patient motion in between the calibration and accelerated scans. This assumption is violated in several clinical imaging scenarios, hence leading to distortion (artifacts) in the reconstructed images. In contrast, the present invention does not require a calibration scan as is elaborated further in the following.

II. The method of GRAPPA does not require a separate calibration scan and hence falls into the category of auto-calibrating (also known as self-calibrating) parallel imaging techniques—as does the present invention. The receiver coil characteristics in auto-calibrated techniques are estimated based on a few extra data samples collected within the so-called auto-calibration-scan (ACS) region in the k-space (described further below and in FIG. 4). Note that the extra data samples are acquired during the accelerated scan and no additional calibration scan is needed. The major drawback of GRAPPA and related methods (in contrast to the present invention) is that GRAPPA merely enforces consistency of the reconstruction to the ACS data. In other words, unlike the present invention, the potential aliasing distortion in the reconstructed image is not dealt with. As a result, even with state-of-the-art receiver channel hardware and coil arrays, acceleration (imaging speed-up) factors beyond 2 or 3 would typically result in noticeable image distortion, and hence are rarely attempted in clinical practice.

The present invention is dubbed ACSIOM (Auto-Calibrating Sensitivity-encoded imaging using an Interpolation-Optimal MIMO kernel). ACSIOM is a k-space-based self-calibrating PMR imaging technique that optimally estimates a MIMO filter bank structure for reconstruction of the fully-encoded outputs of all receiver channels (which are unavailable owing to imaging acceleration). Unlike GRAPPA and other related methods, ACSIOM accounts for aliasing effects and minimizes the corresponding image distortion by optimally adapting the image-reconstruction kernel. ACSIOM outperforms GRAPPA especially in cases with limited ACS measurements and high PMRI acceleration factors.

The following, is a theoretical and mathematical description of the imaging process prescribed by the invention. (The order in which these steps are performed can be varied in certain scenarios.

I. Data Acquisition Using an Auto-Calibrating MR Scan: During the imaging scan we acquire MR data according to the prescribed k-space sampling pattern so that both calibration data (i.e., ACS data) and accelerated data are simultaneously acquired. A preferred embodiment for such a scan is the well-known auto-calibrating Cartesian k-space sampling scheme used in the method of GRAPPA. Complementary scan data such as a noise-only scan for the purpose of estimating cross-channel noise covariance can also be efficiently acquired as described by P. Kellman and E. R. McVeigh in the paper: "*Image reconstruction in SNR units: A general method for SNR measurement,*" *Magn Reson Med* December 2005, vol. 54(6), pp. 1439-47.

II. Identification of the Multi-Input Multi-Output (MIMO) System: This is the main computational step of the method in which an optimal MIMO system comprising a plurality of shift-invariance finite-impulse-response (FIR) filters is identified. The identification process utilizes the MR data acquired in the previous step and uses a novel scheme to ensure high-quality image reconstruction in the subsequent step. This is achieved by solving an optimization problem of the form given in Eq. (2) below.

III. Image Reconstruction Using the Identified MIMO System: Finally an MR image (or sequence images) is reconstructed from the MR data acquired from all coils by applying the identified MIMO system to the measured data. Since the MIMO system is constructed to be shift-invariant and FIR, this process is efficient and straightforward: convolving the input with the MIMO system's filters and summing the result for each channel according to the structure of the MIMO bank.

In the following description, the object being imaged is denoted by $X(r)$ where $r=[x, y]^T$ is the 2-dimensional spatial variable. Fourier transforms of signals are indicated by the variables used, e.g., $X(k_x, k_y)$ is the k-space signal corresponding to the image X and denotes the Fourier transform of $X(x, y)$ along the x and y axes; $k=[k_x, k_y]^T$ denotes the spatial frequency (k-space position); specifically, $k_x$ and $k_y$ refer to the spatial-frequency along the x and y axes, respectively. The parallel imaging acceleration (subsampling) factor is denoted by R.

MRI OBSERVATION MODEL: The observation model describes how the data collected by the MR scanner is related to the object being imaged. For parallel MRI with N receiver coils (each corresponding to an independent receiver channel), the observation equation is written as follows:

$$D_l(k) = \int_{FOV} H_l(r) X(r) e^{-i2\pi k^T r} dr \qquad \text{Eq. (1)}$$

$$r = [x\ y]^T$$

where $H_l(r)$, $l=1, \ldots, N$ denotes the complex spatial sensitivity function for the l-th coil (channel), which characterizes its spatial encoding profile. The data collected by the l-th coil for an object is given by samples of $D_l(k)$ acquired according to the specified sampling schedule $\psi_D$; additional data noise can also be incorporated in the above equation. (For details on noise in PMRI, see the reference by Kellman and McVeigh cited above).

Figure 3:
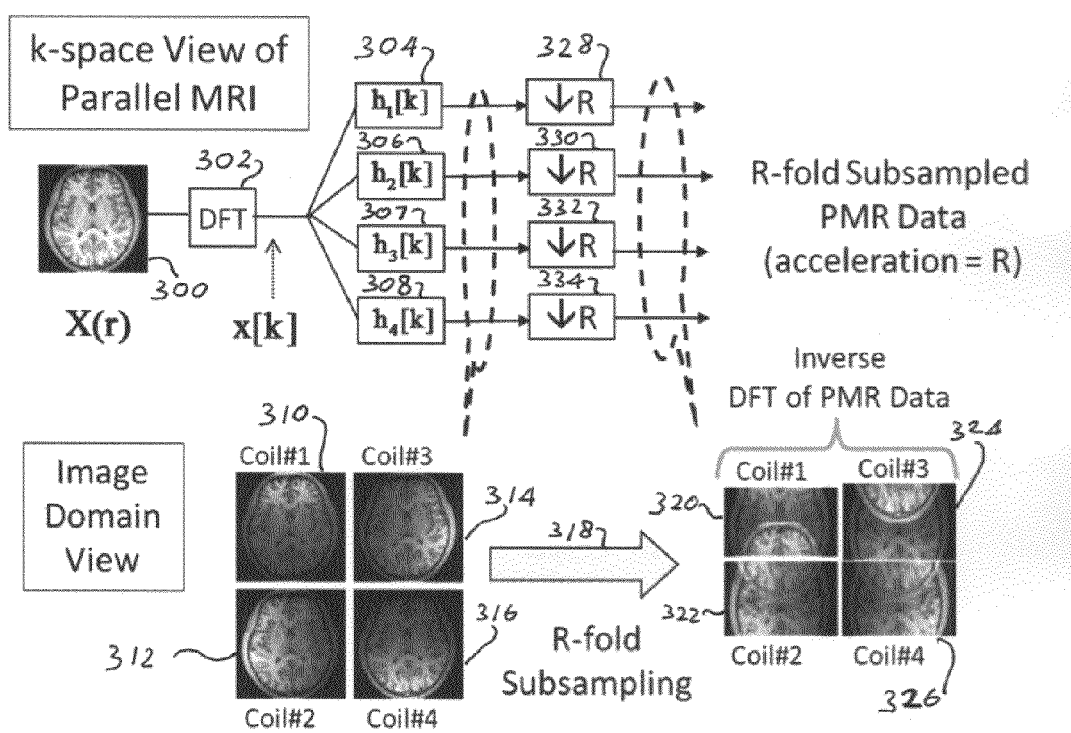
FIG. 3 is a graphic illustration of the signal subsampling in parallel MRI.

In particular reference to FIG. 3, as described by Eq. (1), the spatial encoding in PMRI is in form of multiplication of the object spin density (the "image") $X(r)$ by the sensitivity functions of the receiver coils, producing a plurality of spatially weighted images (310-316). Alternatively, this multiplication can be formulated as convolution in the k-space (Fourier domain) by the Fourier transform of the coil sensitivity functions, here denoted by $h_l[k]$, $l=1, \ldots, N$. This subsampling of the k-space (2D spatial Fourier domain, related to the signal space by a Fourier Transform (302)) signal can be modeled as shown FIG. 3, which describes the effect of R-fold uniform subsampling (acceleration) for a PMRI scenario with N=4 receiver channels. The top half of FIG. 3 describes one way of formulating R-fold subsampling (328-334) in k-space, where each channel is treated as a filter (304-308) in k-space. In the image domain, the effect of subsampling (318) is described by aliasing of individual coil images (310-316) producing aliased images (320-326) as described by the lower half of FIG. 3 (with R=2). The image reconstruction task in k-space-based PMRI techniques such as the present invention (also holds for GRAPPA) is to undo the aliasing in each of the coil images (with R-fold subsampling (328-334)), hence reconstructing a spatially-weighted but aliasing-free image for each of the receiver channels.

AUTO-CALIBRATING SAMPLING SCHEDULE: A sampling schedule (or scheme) $\psi_D$ prescribes the MR data that needs to be acquired at each time instant during the MR scan. The goal in PMRI is to enable alias-free image reconstruction from a reduced set of k-space (2D spatial Fourier domain) data samples. In most scenarios for Cartesian k-space sampling trajectories, the subsampling in k-space is uniform (ignoring the calibration data). Assuming no calibration data acquisition, the imaging speed acceleration from an R-fold (R>1) subsampling is equal to R. However, as noted above, in auto-calibrating PMRI the MR acquisition scheme is designed so that a few extra samples—typically within the low-frequency/central k-space region—are acquired. The data samples that fall into this fully-sampled region are typically referred to as auto-calibrating scan (ACS) data (description of such MR acquisition schemes are disclosed in U.S. Pat. No. 6,289,232 issued on Sep. 11, 2001; and in U.S. Pat. No. 6,841,998 issued on Jan. 11, 2005).

Figure 4:
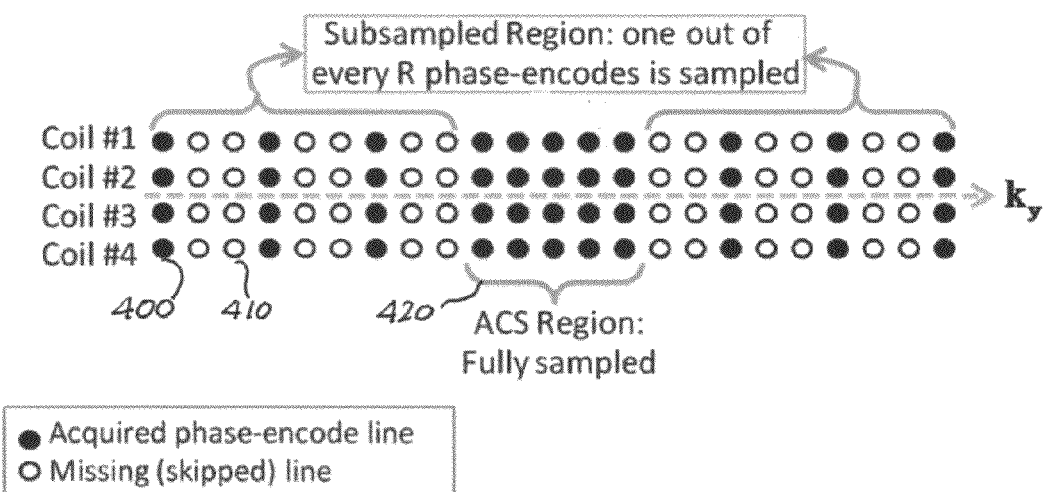
FIG. 4 is a graphic illustration of an example of an auto-calibrating k-space sampling pattern utilized in auto-calibrating parallel MRI scheme.

An example of an auto-calibrating sampling schedule is depicted in FIG. 4 wherein each filled dot (400) represents a sampled line, i.e., a fully sampled phase-encode line (according to the Nyquist sampling criterion) along the readout ($k_r$) direction, and the empty dots (410) represent the skipped phase-encode lines that are not measured. The sampling pattern is determined by gradient pulses in the MR pulse sequence (FIG. 1) and hence is the same for all receiver coils. The ACS region (420) in the figure (and most imaging scenarios) is centered at the $k_y$=0 location (center of k-space). In FIG. 4, the uniform subsampling (acceleration) factor is assumed to be R=3. However, note that owing to the fully sampled ACS region, the overall PMRI acceleration, computed as the ratio of the number of sampled phase-encode lines to the total number of phase-encodes (determined based on the image resolution), is less than 3 (between 2 and 3).

Figure 5:
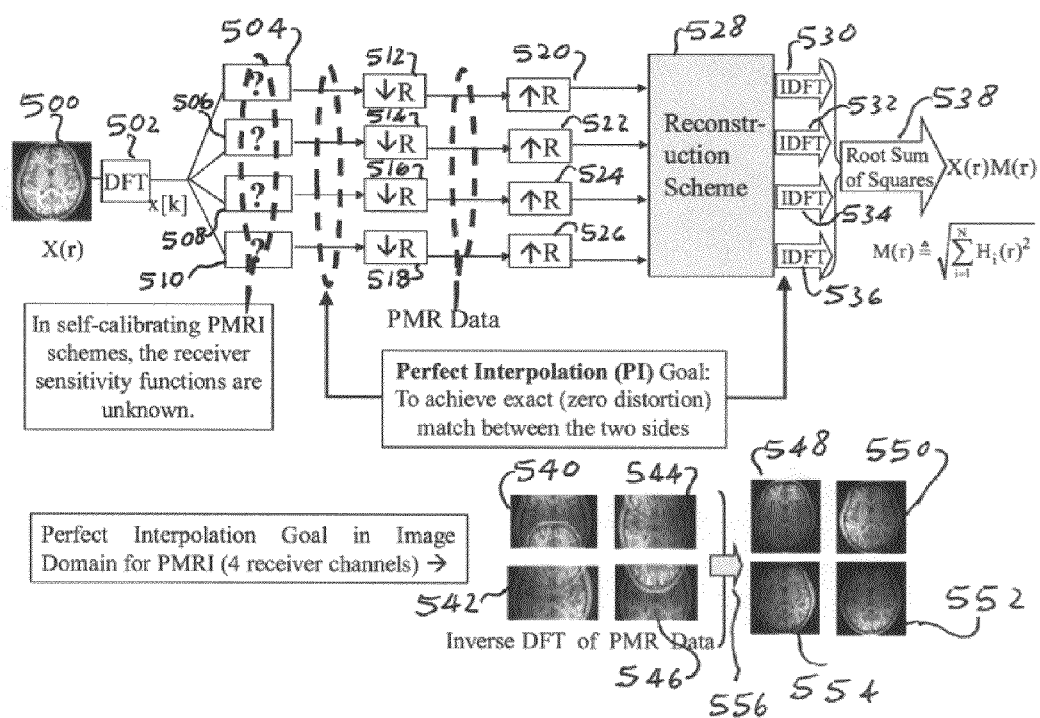
FIG. 5 is a graphic illustration of the ideal reconstruction goal in the present invention.

MIMO SYSTEM IDENTIFICATION SCHEME: As mentioned above, the image reconstruction task in k-space-based PMRI techniques such as the present invention is to undo the aliasing in each of the coil-measured images, hence reconstructing a spatially-weighted but aliasing-free image for each of the receiver channels. Referring to FIG. 5, in a self-calibrating PMRI technique such as the present invention the receiver sensitivity functions (504-510) are not known. Referring still to FIG. 5, we define the condition of perfect match between the true and reconstructed channel outputs (described in the figure) to be the "perfect interpolation" (PI) condition for recovery of missing samples in the PMR data. The ideal image reconstruction goal in the present invention (which is not necessarily achieved, that is, in practice may only be approximated) is to achieve PI for all receiver channels.

Specifically, for the case of uniform subsampling (512-518) of k-space data, the subsampled data is first upsampled (520-526) (i.e., zeros are inserted in place of missing samples; upsampling is a standard notion in signal processing). Next, the upsampled PMR data is passed through the "reconstruction scheme" (528) with the goal of achieving PI. Subsequently, inverse DFT (530-536) of the output of each channel gives the reconstructed image for that receiver channel (performed for all N receiver channels). Finally, the individual coil images are typically combined to form a "composite image," which if PI is achieved in the reconstruction and the root-sum-of-squares combination method (538) described below is applied would result in a spatially-modulated version of the underlying (ground truth) image X(r) (500). The image combination step (538) is described in more detail at the end of this section (in the "image reconstruction" step of the General Description). The lower half of FIG. 5 provides an example of PI in case of N=4 receiver channels. In case the reconstruction scheme achieves PI, the channel data which if individually reconstructed would produce aliased images (540-546) are perfectly interpolated (556), i.e., all missing phase-encode lines are reconstructed with no distortion producing after inverse DFT (530-536) the alias-free spatially-modulated images (548-554).

Figure 6:
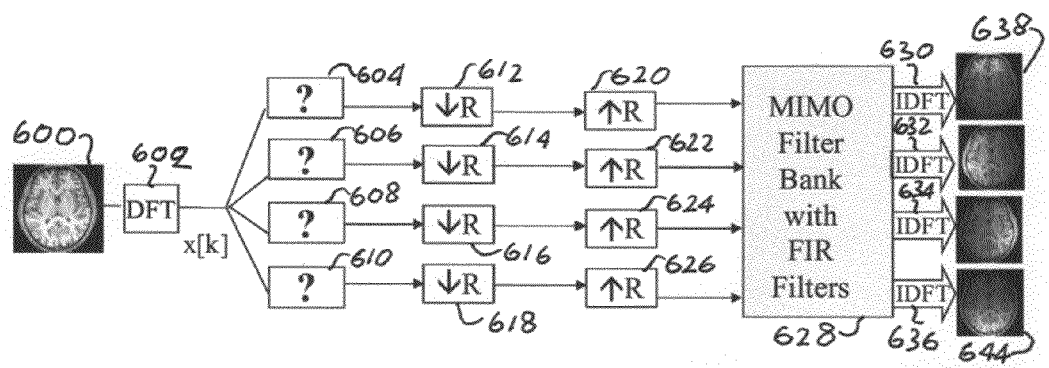
FIG. 6 is a graphic illustration of the operation of a MIMO filter bank used to practice the present invention.
Figure 7:
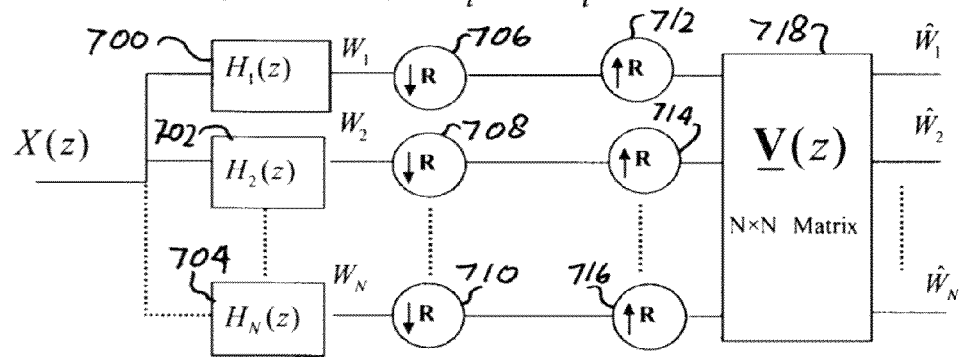
FIG. 7 is a graphic illustration of the Perfect Interpolation Condition in the z-domain for a MIMO filter bank used to practice the present invention.
Figure 8:
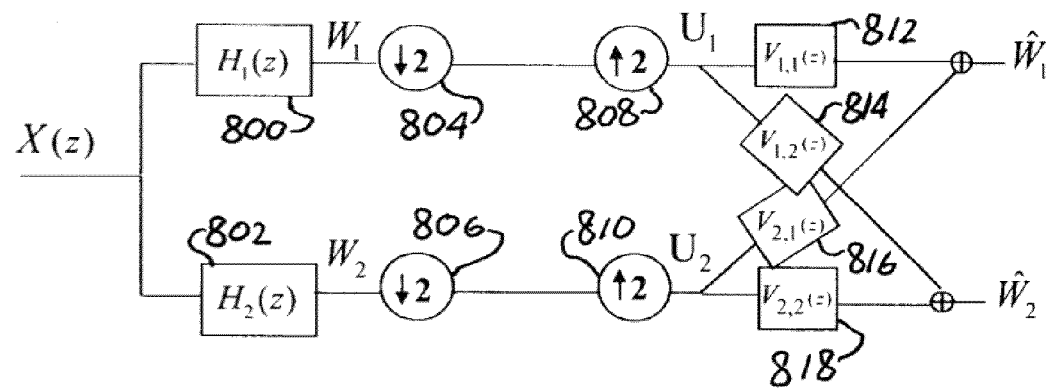
FIG. 8 is graphic illustration of the structure of a MIMO filter bank used to practice present invention.

Referring to FIG. 6, in the present invention, the reconstruction scheme processes the subsampled (612-616) PMR data using a finite impulse response (FIR) MIMO filter bank (628), denoted by V, with N inputs and N. The maximum number of FIR filters in the MIMO bank in this case is clearly equal to $N^2$. Referring to FIG. 7 and to FIG. 8 the z-transform of the MIMO filter bank V(z) can be expressed as an N-by-N matrix of finite-order polynomials. Note that the interpolated "channel images" (i.e., the outputs of the MIMO system) are denoted by $\{\hat{W}_i\}_{i=1}^N$. The detailed structure of a general MIMO filter bank is shown in FIG. 8, for the case of a one-dimensional signal and N=2 receiver channels. The filter bank V(z) is seen to comprise a number of filters (812-818) connecting the upsampled inputs to the outputs. A comprehensive treatment of MIMO filter banks is provided in the following reference: P. P. Vaidyanathan, "*Multirate Systems and Filter Banks,*" Prentice-Hall, Englewood Cliffs, N.J., 1995.

The present method identifies the MIMO filter bank so that high quality image reconstruction for all (or a selected subset) of the PMR channels is achieved. We denote the set of acquired parallel MR data by D (which in general may include data acquired prior or after the current MR scan) and the set of coil sensitivity function (also referred to as sensitivity profile) by P. As described in previous sections, the goal in self-calibrated PMRI (pertaining to the present invention) is to perform the image reconstruction only from the knowledge of D and without having any access to P. To achieve this, the present invention requires a measure of image quality for the reconstructed channel images that is independent of P.

Recall that the MR data sampling schedule was denoted by $\psi_D$. Denote by $\psi_V$ the set of parameters and constraints restricting the MIMO filter bank, such as the filter length allocated for each of the $N^2$ FIR filters of the filter bank. (Note that some filter lengths may be forced to be zero a priori, thereby reducing the total number of FIR filters in the unknown MIMO system). Moreover, denote the set of all MIMO filter banks that satisfy constraints in $\psi_V$ by M($\psi_V$). Also, denote the set of known parameters of the channel noise statistics by $\Sigma_n$. We denote an object model that formulates any known prior knowledge or constraints on the underlying channel images $\{W_i\}_{i=1}^N$ by model class $M_W$. In most scenarios, no useful constraint on the channel images is known a priori, which translates into a trivial $M_W$, i.e., the entire space of finite dimensional images with the same resolution. In this case, the term $M_W$ should be dropped from the following formulation. Similarly, if no knowledge of channel noise characteristics is available, $\Sigma_n$ should be dropped from the formulation.

As part of our imaging scheme, the distortion-optimal MIMO filter bank is identified (or approximated) using the acquired data from all coils including the ACS data, and by incorporating the information provided by the system constraints in addition to constraints on the properties of the noise and underlying signals as formulated above. In one aspect of the invention, the MIMO filter bank is characterized by an N-by-N polynomial matrix V(z) or equivalently by the coefficients of the polynomial entries of V(z), which correspond to the impulse responses (weights) of the filters. The collection of all filter weights in the MIMO filter bank is denoted by V. According to another aspect of the invention, the MIMO filter bank includes less than N outputs. In accordance with yet another aspect of the invention, the interpolation kernel is more general and may be in form of an infinite impulse response (IIR) filter bank, a shift-varying filter bank, or spline interpolation (described in the following review paper: M. Unser, "Splines: A perfect fit for signal and image processing," IEEE Signal Processing Magazine, vol. 16, no. 6, pp. 22-38, 1999).

Identification of the MIMO system is accomplished by solving for $\underline{V}$ based on an optimization problem of the following form:

$$\underline{V}^* = \underset{\underline{V} \in M(\Psi_V)}{\operatorname{argmin}} \; C_I[Q(\Psi_D, D, \Sigma_n), M_W, D, \Sigma_n] \qquad \text{Eq. (2)}$$

where Q is a measure of the expected quality of the reconstruction, which depends upon the MR sampling schedule $\psi_D$, the acquired MR data set D, and the channel noise characteristics $\Sigma_n$. $C_I$ is our image-reconstruction cost function that penalizes for loss in image quality and deviation from the measured data samples D (the latter referred to as "data fidelity" or "data consistency"). It can also account for minimizing the power (or shaping the spectrum) of the reconstruction noise and may include prior knowledge of channel images.

In the present invention, Q is described based on the notion of PI defined above. That is, in addition to data fidelity, we penalize the expected image distortion in the output of the MIMO filter bank, i.e., deviation from the PI condition. Since in practice the channel images are not fully known (due to subsampled channel outputs), Q is typically an approximate measure of distortion in the reconstructed channel images.

Figure 9:
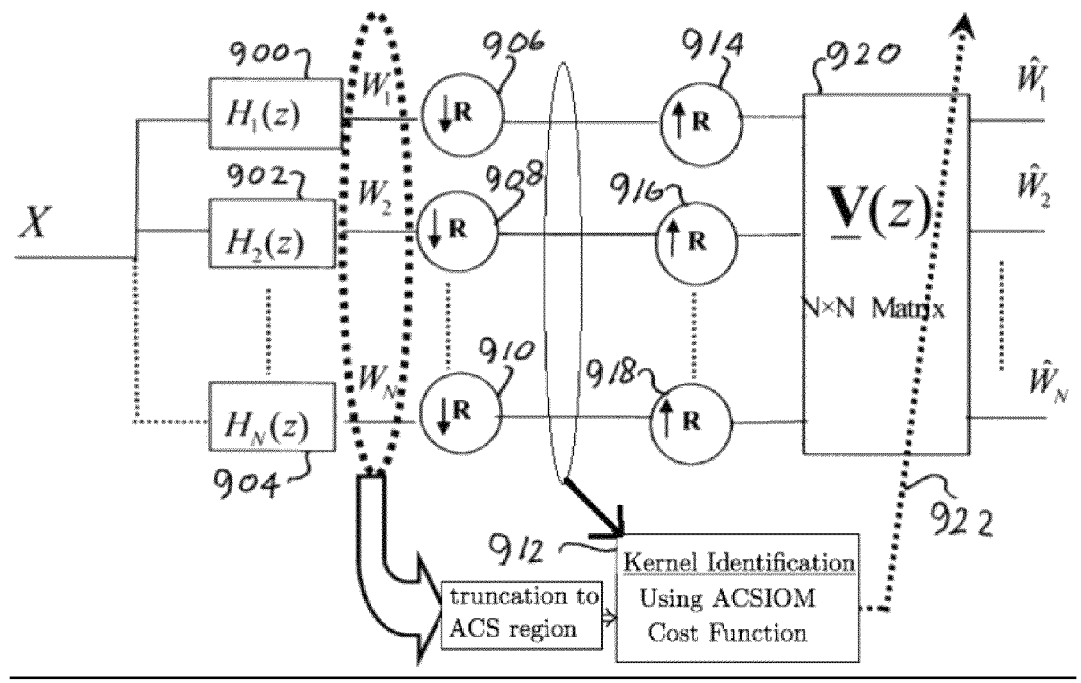
FIG. 9 is a graphic illustration of the process for identification of the filter bank kernel in the present invention.

Referring to FIG. 9, the identification process for the MIMO system based on the optimization process described in Eq. (2), dubbed "ACSIOM identification," is described as adapting (922) a MIMO system (920), characterized by an N-by-N polynomial matrix V(z) (as shown in in the figure) or equivalently its coefficient set $\underline{V}$, based on partially known channel outputs $\{W_i\}_{i=1}^{N}$ (data obtained by subsampling (906-910) in addition to ACS data obtained from the outputs of the channels (900-904) as illustrated in FIG. 4), so that the cost function in Eq. (2) is minimized.

Numerical solutions to the optimization problem described in Eq. (2), in general involve solving a nonlinear optimization problem, for which several numerical techniques are available. Some of the particular algorithms for solving such problems are discussed in a book by Dimitri P. Bertsekas, titled "*Nonlinear Programming,*" *ISBN:* 1-886529-00-0, *Athena Scientific,* 2004. In one preferred embodiment (for example see Eq. (7) below), the identification problem formulated in Eq. (2) can be converted to a linear inverse problem. Methods for solving such problems are discussed in several texts, for instance, "*Introduction to Inverse Problems in Imaging*", by M. Bertero and P. Boccacci, IOP Publishing Ltd., 1998. Furthermore, several numerical methods for solving such problems, including various forms of regularization such as Tikhonov-type techniques, are discussed in a book by P. C. Hansen entitled "*Rank-Deficient and Discrete Ill-Posed Problems: Numerical Aspects of Linear Inversion*", *ISBN:*0-89871-403-6, *SIAM*, Philadelphia, 1999.

Note that the set of unknowns $\underline{V}$ in the optimization process of Eq. (2), describes the image reconstruction in k-space. It is well known that using DFT operators (in form of matrices), one can rewrite Eq. (2) in terms of the image-domain parameters that also fully characterize the MIMO system, hence providing an equivalent formulation of the problem. Furthermore, in 2D Cartesian sampling of k-space, the readout (frequency encoding) direction is almost always fully sampled (or even oversampled) relative to the required spatial Nyquist sampling rate. Therefore, by computing an inverse DFT along the readout direction, one can re-derive all of the descriptions mentioned above in the $(x, k_y)$ domain, instead of the 2D k-space $(k_x, k_y)$ which was the case above. This $(x, k_y)$ domain is typically referred to as the "hybrid space" (disclosed in U.S. Pat. No. 7,282,917 issued on Oct. 16, 2007; and U.S. Pat. No. 7,492,153 issued on Feb. 3, 2009; and U.S. Pat. No. 7,692,425 issued on Apr. 6, 2010). Although the MIMO system identification in the hybrid space is fundamentally the same as the k-space version described above, it may exhibit noticeable computational advantages in certain MR imaging scenarios.

Finally, note that the identified MIMO filter bank $\underline{V}^*$ can be used to reconstruct images other than the input that was used for its identification. In other words, once we identify the MIMO system (that ideally would provide PI), we can apply the same reconstruction scheme using the same $\underline{V}^*$ filter weights, to reconstruct PMR data acquired from other objects prior or after the current MR scan. This method is especially applicable to and potentially beneficial in dynamic imaging applications, e.g., cardiac MRI schemes that are accelerated by parallel imaging.

IMAGE RECONSTRUCTION: In the last stage of the present invention, an MR image (or sequence of images) is reconstructed from the MR data acquired from all coils during the imaging scan, by applying the identified MIMO system (e.g., characterized by the coefficient set $\underline{V}^*$ as defined above) to the measured data. In one aspect of the invention, the MIMO system is constructed to be shift-invariant and FIR; this implies that the process is efficient and straightforward: convolving the input with the MIMO system's filters and summing the result for each channel according to the structured of the MIMO bank. Next, inverse DFT of each of the N outputs gives the reconstructed image for that receiver channel (process is repeated for all N receiver channels). In another aspect of the invention, the interpolation kernel is used to "synthesize" multiple intermediate MR data sets using the MIMO filter bank and one or images are reconstructed from these synthesized data sets.

In the final step of image reconstruction, the individual coil images are typically combined to form a "composite image." This step is generally optional. Referring to FIG. 5, this image combination step (538) is typically chosen to be the square root of the sum of pixel-wise squared values of the magnitude of reconstructed channel images (referred to as "sum-of-squares" reconstruction). Other alternatives generally utilize the acquired MR data in addition to the reconstructed channel images reconstructed. Two such alternative image combination techniques are:

I. The linear minimum variance estimator (also known as the linear minimum mean square estimator) is used to compute the composite image. The estimator uses the reconstructed channel images in addition to the ACS or other calibration data acquired from the receiver coils. Several numerical methods for solving such problems are discussed in a book by P. C. Hansen entitled "*Rank-Deficient and Discrete Ill-Posed Problems: Numerical Aspects of Linear Inversion*", *ISBN:*0-89871-403-6, *SIAM*, Philadelphia, 1999.

II. The composite image is computed according to the SENSE method with acceleration factor assumed to be unity. This scheme involves deriving a direct estimate of channel sensitivity functions using the acquired calibration data. More details are described in the following reference and references therein: P. Kellman and E. R. McVeigh, "*Image reconstruction in SNR units: A general method for SNR measurement,*" *Magn. Reson. Med*, December 2005, vol. 54(6), pp. 1439-47.

DESCRIPTION OF THE PREFERRED EMBODIMENT

For the preferred embodiment, we describe the application of our method to imaging of a 2D slice using a spinwarp pulse-sequence. For notational convenience, x, y and z are chosen to be the desired readout, phase-encoding and slice-select gradient axes respectively.

MR IMAGING SYSTEM: Referring first to FIG. 1, there is shown the major components of a preferred MRI system that incorporates the present invention. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients Gx, Gy and Gz used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by a separate RF coil array described below are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform.

The RF system 26 also includes a plurality of RF receiver channels. In the preferred embodiment 8 receiver channels are employed although any number of receive channels may be employed depending on the receive coil array being used. Each RF receiver channel includes an RF amplifier that amplifies the NMR signal received by the coil to which it is connected.

The physiological acquisition controller 36 receives signals from a number of different sensors connected to the patient, which are typically used by the pulse sequence server 18. The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 operates to receive the real-time NMR data and provide buffer storage such that no data is lost by data overrun. In some scans the data acquisition server 20 does little more than pass the acquired NMR data to the data processor server 22.

The data processing server 22 receives NMR data from the data acquisition server 20 and processes it in accordance with an image reconstruction method. Images reconstructed by the data processing server 22 are conveyed back to the workstation 10 where they are stored. Real-time images may be output to operator display 12 or a display 42 which is located near the magnet assembly 30 for use by attending physicians. Batch mode images or selected real time images are stored in a host database on disc storage 44. The workstation 10 may be used by an operator to archive the images, produce films, or send the images via a network to other facilities.

Figure 2:
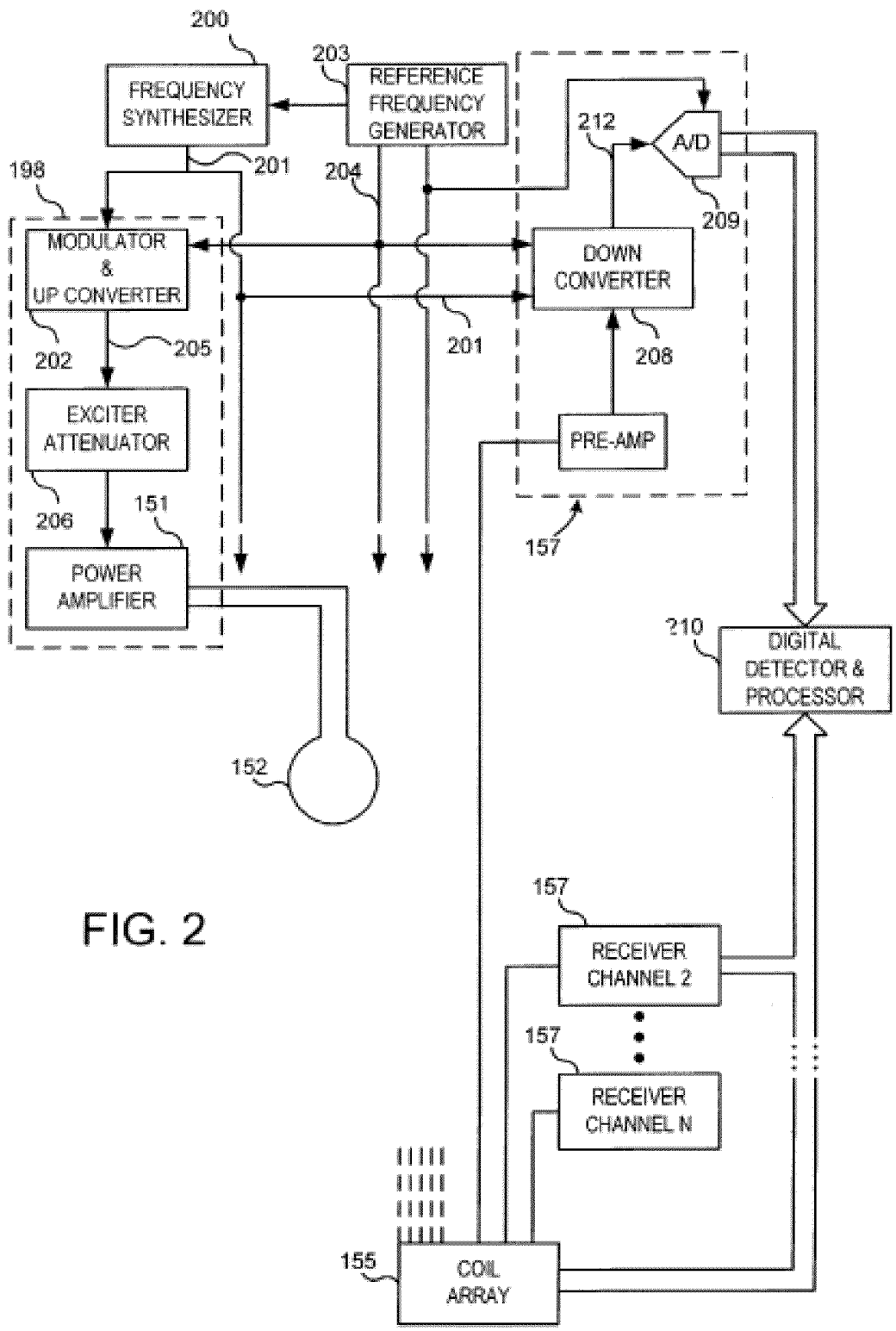
FIG. 2 is an electrical block diagram of the transceiver that forms part of the MRI system of FIG. 1.

Referring particularly to FIG. 2, the RF system 26 includes a transmitter 198 that produces a prescribed rf excitation field. The base, or carrier, frequency of this RF excitation field is produced under control of a frequency synthesizer 200 which receives a set of digital signals from the pulse sequence server 18. These digital signals indicate the frequency and phase of the RF carrier signal produced at an output 201. The RF carrier is applied to a modulator and up converter 202 in the transmitter 198 where its amplitude is modulated in response to a signal R(t) also received from the pulse sequence server 18. The signal R(t) defines the envelope, or waveform, of the RF excitation pulse to be produced and is produced by sequentially reading out a series of stored digital values. These stored digital values may, be changed to enable any desired RF pulse envelope, or waveform, to be produced by the transmitter 198. The RF pulses produced by the transmitter 198 can thus be separately controlled by the pulse sequence server 18.

The magnitude of the RF excitation pulse produced at output 205 is attenuated by an exciter attenuator circuit 206 in the transmitter which also receives a digital command from the pulse sequence server 18. The attenuated RF excitation pulses are applied to a power amplifier 151 in the transmitter 198. The power amplifier is a current source device that connects to the whole body rf coil 152, although local coils may also be used in some clinical applications.

Referring still to FIG. 2 the signal produced by the subject is picked up by a coil array 155 and applied to the inputs of a set of receive channels 157. A pre-amplifier 160 in each receiver cannel 157 amplifies the signal by an amount determined by a digital attenuation signal received from the pulse sequence server 18. The received signal is at or around the Larmor frequency, and this high frequency signal is down converted in a two step process by a down converter 208 which first mixes the NMR signal with the carrier signal on line 201 and then mixes the resulting difference signal with a reference signal on line 204. The down converted NMR signal is applied to the input of an analog-to-digital (A/D) converter 209 which samples and digitizes the analog signal and applies it to a digital detector and signal processor 210 which produces 16-bit in-phase values and 16-bit quadrature values corresponding to the received signal. The resulting stream of digitized in-phase and quadrature values of the received signal are output to the data acquisition server 20. The reference signal as well as the sampling signal applied to the A/D converter 209 is produced by a reference frequency generator 203. In the preferred embodiment of the invention the coil array 155 includes only 8 coil elements and eight corresponding receive channels are employed.

IMAGING METHOD OVERVIEW: As mentioned in the general description of the invention, the acquisition and display of images according to the present invention can be separated into three separate stages: (1) auto-calibrating MR scan; (2) identification of the MIMO interpolation filter bank, (3) image reconstruction using the identified MIMO system.

AUTO-CALIBRATING MR SCAN: Using the N receiver coils, N sets of k-space samples on a two-dimensional rectilinear (Cartesian) trajectory are simultaneously acquired consisting of a plurality of phase-encode lines, shown as filled dots (400) in FIG. 4. The acquired k-space data is a union of: (i) auto-calibration k-space data, which are the samples located in the fully-sampled ACS region (420), typically centered around the $k_y$=0 line; and (ii) uniformly R-fold subsampled data where the subsampling factor R is a rational number measured relative to the Nyquist spacing required for the specified FOV. The description of such an MR scan is provided above in the general description of the invention.

IDENTIFICATION OF THE MIMO FILTER BANK: Referring particularly to FIG. 9, the MIMO system (920) can be characterized by an N-by-N polynomial matrix $\underline{V}(z)$. Since with rectilinear sampling of k-space, data acquisition along the $k_x$ dimension is at or beyond the required Nyquist rate, the MR reconstruction problem reduces to one dimensional subsampling along $k_y$ (see the paper by K. P. Pruessmann et al., referenced in the general description of the invention.).

Denote the set of FIR filters in the MIMO system as $\underline{V}(z)=[V_{p,n}(z)]_{1\le p,n \le N}$ where z corresponds to the z-transform along $k_y$, and $$V_{p,n}(z) = \sum_{k=-\lfloor m_v/2 \rfloor}^{\lceil m_v/2 \rceil - 1} v_{p,n}[k] z^{-k} \qquad \text{Eq. (3)}$$

where $m_v$ is the filter length for each of the filters $v_{p,n}$ in the MIMO filter bank. Using the filter-bank structure depicted in FIG. 8 for channel number p ($1 \le p \le N$), it can be shown that:

$$\hat{W}_p(z) = \sum_{\ell=0}^{R-1} X(z\gamma^\ell) A_\ell^{(p)}(z)$$

where $\gamma = e^{-j2\pi/R}$ and $$A_\ell^{(p)}(z) = \frac{1}{R} \sum_{n=1}^{N} V_{p,n}(z) H_n(z\gamma^\ell).$$

The perfect interpolation (PI) condition requires $\hat{W}_p(z) = X(z) H_p(z)$ for all p=1, ..., N. Hence, in order to achieve PI for any input x[n], we need to have:

$$\forall p, 1 \le p \le N, A_0^{(p)}(z) = H_p(z), A_\ell^{(p)}(z) = 0 \text{ for } \ell = 1, \ldots, R-1.$$

As explained in the book P. P. Vaidyanathan, "*Multirate Systems and Filter Banks*," Prentice-Hall, Englewood Cliffs, N.J., 1995, the terms $A_\ell^{(p)}(z)$ correspond to aliased components and here are constrained to be zero.

By rewriting this condition in matrix form, we have the following necessary and sufficient condition for PI, which is in form of a z-transform relationship that should hold for all channels p=1, ..., N:

$$\underbrace{\begin{bmatrix} H_1(z) & H_2(z) & \cdots & H_N(z) \\ H_1(z\gamma) & H_2(z\gamma) & \cdots & H_N(z\gamma) \\ \vdots & \vdots & \vdots & \vdots \\ H_1(z\gamma^{R-1}) & H_2(z\gamma^{R-1}) & \cdots & H_N(z\gamma^{R-1}) \end{bmatrix}}_{H(z)} \begin{bmatrix} V_{p,1}(z) \\ V_{p,2}(z) \\ \vdots \\ V_{p,N}(z) \end{bmatrix} = \begin{bmatrix} R H_p(z) \\ 0 \\ \vdots \\ 0 \end{bmatrix} \qquad \text{Eq. (4)}$$

where H(z) is of size R×N and is typically referred to the "alias component" matrix. (For details and similar derivations, refer to P. P. Vaidyanathan, "*Multirate Systems and Filter Banks*," Prentice-Hall, Englewood Cliffs, N.J., 1995.)

Multiplying the r-th row on both sides of Eq. (4) by $X(z\gamma^{r-1})$ for every r=1,2, ..., R, we arrive at:

$$\underbrace{\begin{bmatrix} W_1(z) & W_2(z) & \cdots & W_N(z) \\ W_1(z\gamma) & W_2(z\gamma) & \cdots & W_N(z\gamma) \\ \vdots & \vdots & \vdots & \vdots \\ W_1(z\gamma^{R-1}) & W_2(z\gamma^{R-1}) & \cdots & W_N(z\gamma^{R-1}) \end{bmatrix}}_{W(z)} \begin{bmatrix} V_{p,1}(z) \\ V_{p,2}(z) \\ \vdots \\ V_{p,N}(z) \end{bmatrix} = R \begin{bmatrix} W_p(z) \\ 0 \\ \vdots \\ 0 \end{bmatrix}, \qquad \text{Eq. (5)}$$

for all p = 1, 2, ..., N

Because it is derived from Eq. (4), Eq. (5) also expresses a necessary and sufficient condition for PI. It is important to note that Eq. (5) has the desirable feature of having no explicit dependence on the receiver channels. In fact, it only involves the channel outputs and the MIMO filter bank. Therefore, we refer to Eq. (5) as the "blind PI relations."

In the following, we express Eq. (5) in terms of constraints on the impulse responses of the MIMO filter bank. Denote the matrix form of the linear convolution operator corresponding to a filter with impulse response $w_i[.]$ of length $m_w$ with a signal of length $m_v$ by $C_{m_v}[w_i]$, which has a size of $(m_w + m_v - 1) \times m_v$. Define the "chopped" convolution of a filter $w_i[.]$ of length $m_w$ with a signal of length $m_v$ to be the result of linear convolution that is truncated to the support of the filter $w_i[.]$ and hence is of length $m_w$. Our definition of chopped convolution coincides with the "same" option used for computing a 1-dimensional or 2-dimensional convolution in the popular MATLAB software (Mathworks, Natick, Mass.) as in the command conv(a,b,'same') or conv2(a,b,'same') where a and b are known vectors or images. (Examples can be found at: http://www.mathworks.com/access/helpdesk/help/techdoc/ref/conv2.html). Denote the matrix form of the chopped convolution operator corresponding to a filter with impulse response $w_i[.]$ of length $m_w$ with a signal of length $m_v$ by $C_{m_v}^c[w_i]$, which has a size of $m_w \times m_v$. In what follows, we will drop the length subscript from the convolution matrix notation since the signal length is fixed to be equal to $m_v$, defined in Eq. (3).

Note that the partially known channel outputs in k-space are denoted by $\{w_i[.]\}_{i=1}^N$ and have a maximum length of $m_w$. Consider all of the N chopped convolution matrices corresponding to the N filters $\{w_i[.]\}_{i=1}^N$ and a signal of length $m_v$. Define the "stack" of all such matrices as follows:

$$\underline{C}[\{w_i\}_{i=1}^N] = [C^c\{w_1\} C^c\{w_2\} \ldots C^c\{w_N\}] \qquad \text{Eq. (6)}$$

Also, denote the Hadamard product of two finite-length vectors a and b as:

$$a \cdot b = \sum_i a[i] b[i],$$

where is the i-th element of the vector a and the summation is over all integer indices. Finally, define vector $e(\gamma) = [1, \gamma, \gamma^2, \ldots \gamma^{m_w-1}]^T$ where $\gamma = e^{-j2\pi/R}$.

At this point, we have all the definitions and tools necessary to write Eq. (5) in terms of the MIMO bank filter coefficients:

$$\underbrace{\begin{bmatrix} \overline{C}[\{w_i\}_{i=1}^N] \\ \overline{C}[\{w_i \bullet e(\gamma)\}_{i=1}^N] \\ \vdots \\ \overline{C}[\{w_i \bullet e(\gamma^{D-1})\}_{i=1}^N] \end{bmatrix}}_{W} \underbrace{\begin{bmatrix} v_{p,1} \\ v_{p,2} \\ \vdots \\ v_{p,N} \end{bmatrix}}_{\vec{v}_p} = \underbrace{\begin{bmatrix} Rw_p \\ \vec{0} \\ \vdots \\ \vec{0} \end{bmatrix}}_{\vec{b}_p}, \quad \text{Eq. (7)}$$

for all $p = 1, 2, \ldots, N$

Eq. (7) describes a linear matrix equation (linear inverse problem). If the forward matrix W is fully known, solving Eq. (7) for all channels determines $\vec{v}_p$ for all p=1,2,..., N, hence fully specifying $\underline{V}$, the set of all coefficients (filter weights) of the MIMO system (in a similar fashion to Eq. (2) in the general description of the invention).

In most practical scenarios, $\{w_i[.]\}_{i=1}^N$ are only partially known (union of ACS and subsampled data; see FIG. 4). Therefore, only a subset of all rows of the forward matrix W in Eq. (7) is known. The preferred embodiment extracts the known rows of Eq. (7) and combines them with equations for data fidelity (data consistency). The resulting system of equations, referred to as the "ACSIOM equation," is:

$$\begin{bmatrix} S_\Psi W \\ S_\Theta \overline{C}[\{u_i\}_{i=1}^N] \end{bmatrix} \vec{v}_p = \begin{bmatrix} S_\Psi \vec{b}_p \\ S_\Theta w_p \end{bmatrix} \quad \text{Eq. (8)}$$

In Eq. (8), the matrix $\overline{C}[\{u_i\}_{i=1}^N]$ is defined by replacing w with u in Eq. (6), where $u_i$ is defined as the upsampled version of the uniformly subsampled PMRI data (without any calibration or ACS data) as described by the output of upsampling operators (620-626) in FIG. 6. Further, $S_\Psi$ and $S_\Theta$ are downsampling operators defined according to the MR sampling schedule $\psi_D$ (including ACS data), which can be expressed in matrix form as a submatrix of the identity matrix by selecting the appropriate rows based on $\psi_D$.

In one specific implementation, using a least squares approach, the solution of the ACSIOM equation can be formulated as the following unconstrained least-squares optimization problem of a cost function, which we call the "ACSIOM cost function":

$$\vec{v}_p^* = \underset{\vec{v}_p}{\operatorname{argmin}} \left\{ \|S_\Psi W \vec{v}_p - S_\Psi \vec{b}_p\|_\Sigma^2 + \|S_\Theta \overline{C}[\{u_i\}_{i=1}^N] \vec{v}_p - S_\Theta w_p\|_{\Sigma'}^2 \right\} \quad \text{Eq. (9)}$$

where the notations $\|a\|_\Sigma$ and $\|a\|_{\Sigma'}$ are used to denote the weighted 2-norm of the vector a with weighting matrices $\Sigma$ and $\Sigma'$, respectively. Equation (9) defines a standard (unconstrained) linear least squares problem and its solution can be derived in closed-form using the well known Moore-Penrose pseudo-inverse. In Eq. (9), the weighting matrices $\Sigma$ and $\Sigma'$ are chosen to incorporate side information such as noise statistics and other forms of prior knowledge. In addition, references for stable (or even regularized) numerical solutions to the ACSIOM Equation (Eq. (8)) and Eq. (9) are provided in the general description of the invention. In the absence of any prior noise statistics or signal knowledge, a reasonable choice for both of the weighting matrices in Eq. (8) is the identity matrix. Referring back to Eq. (2), one can recognize that Eq. (9) is an instance of Eq. (2) wherein the image distortion measure is represented by the first term (inside the "argmin" operator) and the data fidelity (or data consistency) measure is represented by the second term.

As is well known in signal processing and numerical mathematics, an equation such as Eq. (8) can be transformed from one domain to another, e.g., from z-domain to sample domain, k-space to image domain, or by application of a common matrix to both sides. Any one or more of such transformations may be chosen to result in a fully equivalent set of equations or in a new set of equations whose solutions include the solutions to the original system of equations.

IMAGE RECONSTRUCTION: This aspect of the invention is described above in the general description of the invention. In one preferred embodiment for Cartesian MR acquisition, we first take inverse discrete Fourier transform (DFT) for all readout lines along the readout direction. Next, for each one set of the transformed readout data (in the hybrid space), that is, corresponding to a position along the readout direction in image space, we solve Eq. (9) to identify a MIMO filter bank (interpolation kernel). In the next step, we compute the output of the MIMO filter bank using convolutions (as described in the general description of the invention). This results in the synthesized (also called interpolated) intermediate data sets (in the hybrid space), which are in turn used to reconstruct the images (548-554) corresponding to channel outputs. In another embodiment, the same procedure is applied to produce channel images without an inverse DFT step preceding the interpolation, i.e., the interpolation is performed in the 2D k-space.

Another embodiment of the present invention uses IIR filters for the MIMO filter bank. In particular, Eq. (4) as described above also applies to IIR filters. A general reference for such filter banks is the book (cited above) by P. P. Vaidyanathan, Prentice-Hall, Englewood Cliffs, N.J., 1995.

Figure 12:
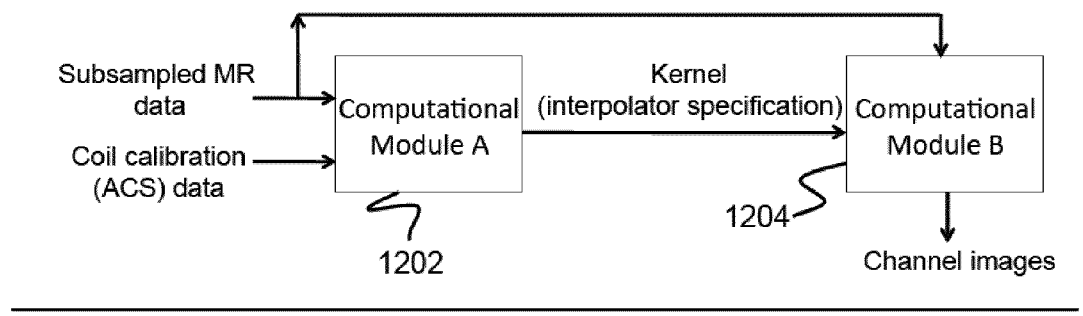
FIG. 12 is a graphic illustration of the process for identification of an interpolation kernel and the use of this kernel to practice the method of the present invention.

Yet another embodiment of the method of the present invention, uses a general interpolation scheme instead of a filter bank, to accomplish the interpolation of the pMRI data sets in the reconstruction scheme (528). As is well known (e.g., the book: D. Dudgeon and R. Mersereau, "Multidimensional digital signal processing," Prentice Hall, 1990; and the book: M. Vetterli and J. Kovacevic, "Wavelets and Subband Coding." Englewood Cliffs, N.J.: Prentice-Hall, 1995) filter banks are but one instance of interpolators. As would be clear from the description of the present invention, other interpolating means would be applicable to accomplish the objectives of the upsampling (520-526) and reconstruction scheme (528). One such example includes spline interpolators, (see, e.g., M. Unser, "Splines: A perfect fit for signal and image processing," IEEE Signal Processing Magazine, vol. 16, no. 6, pp. 22-38, 1999). Any of the known interpolation schemes can be adapted to practice the present method. Referring in particular to FIG. 12, the system shown therein replaces the filter bank (920) and preceding upsampling (914-918) and identification block (912). Computation Module A (1202) represents the computation in Eq. (2) to identify an appropriate interpolator kernel from the pMR data sets, comprising subsampled MR data and possibly additional coil calibration data. The identified interpolation kernel is then used in another Computation Module B (1204) to interpolate the subsampled MR data and produce the channel images.

Yet another embodiment is obtained by identifying and using a plurality of interpolation kernels, each corresponding to different parts of k-space.

As would be clear for someone skilled in the art, although the preferred embodiment and its variations have been described for two-dimensional Cartesian acquisition, the invention with all its features apply to volumetric (three-dimensional) acquisition. Relevant teachings are the theory of multidimensional signal processing (e.g., the book: D. Dudgeon and R. Mersereau, "Multidimensional digital signal processing," Prentice Hall, 1990) and the theory of multidimensional filter banks (e.g., the book: M. Vetterli and J. Kovacevic, "Wavelets and Subband Coding." Englewood Cliffs, N.J.: Prentice-Hall, 1995; and the following paper and the references therein: P. P. Vaidyanathan et al., "Design of doubly complementary IIR digital filters using a single complex allpass filter, with multirate applications," IEEE Trans. on Circuits and Systems, vol. 34, pp. 378-389, 1987). In particular, the various components representing the pMRI data model, data acquisition and interpolation or filtering, and image reconstruction steps are replaced by their higher dimensional analogues. For example, Fourier transforms (602) and (630-636) become higher dimensional; the various filters, including those representing the coil sensitivity functions in k-space (604-610) in the filter bank system model in FIG. 6 and those comprising the filter bank (812-818) become two dimensional; the downsampling operations (612-618) and upsampling operation become two dimensional downsampling and upsampling respectively, with R representing a downsampling or upsampling matrix, respectively; Eq. (5) holds with the z-transform variable becoming a 2-dimensional row vector, and variable y representing a matrix, with corresponding changes to the matrices representing the convolution operators in Equations (6)-(9).

Figure 10:
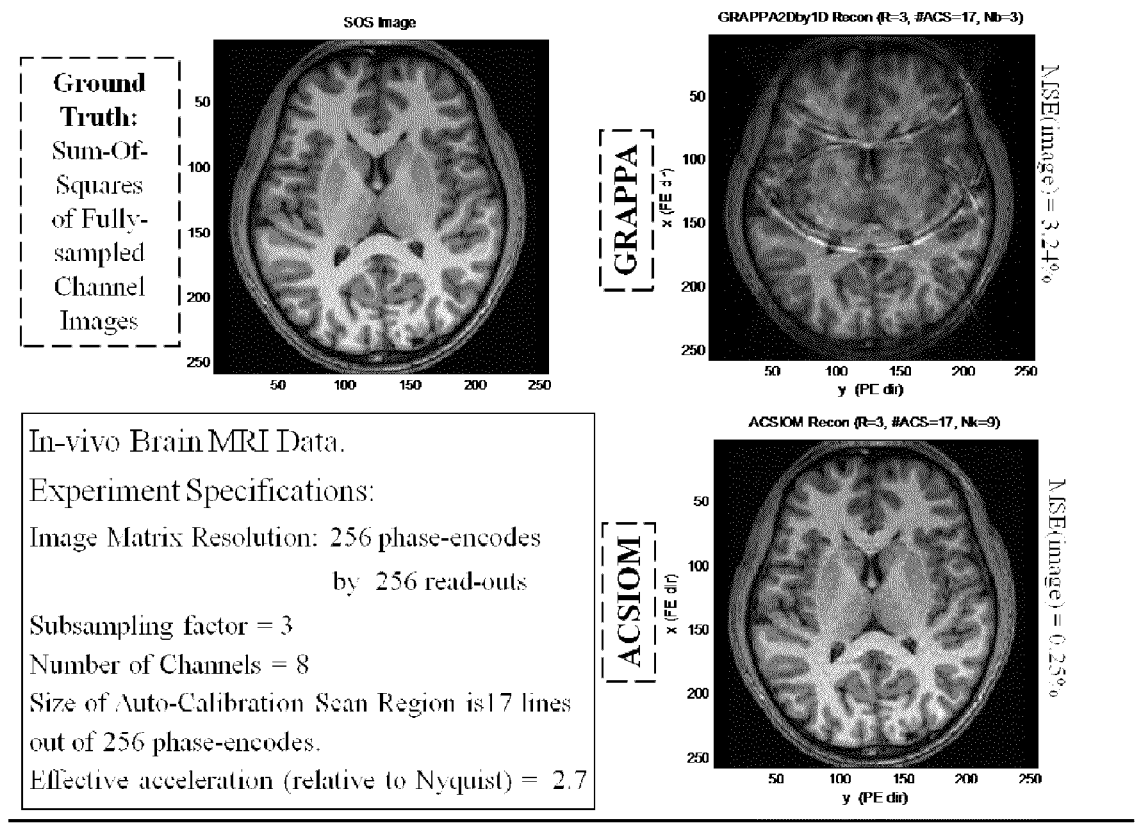
FIG. 10 shows the results of a brain imaging experiment comparing an image produced by the present invention to an image produced by the method of GRAPPA.
Figure 11:
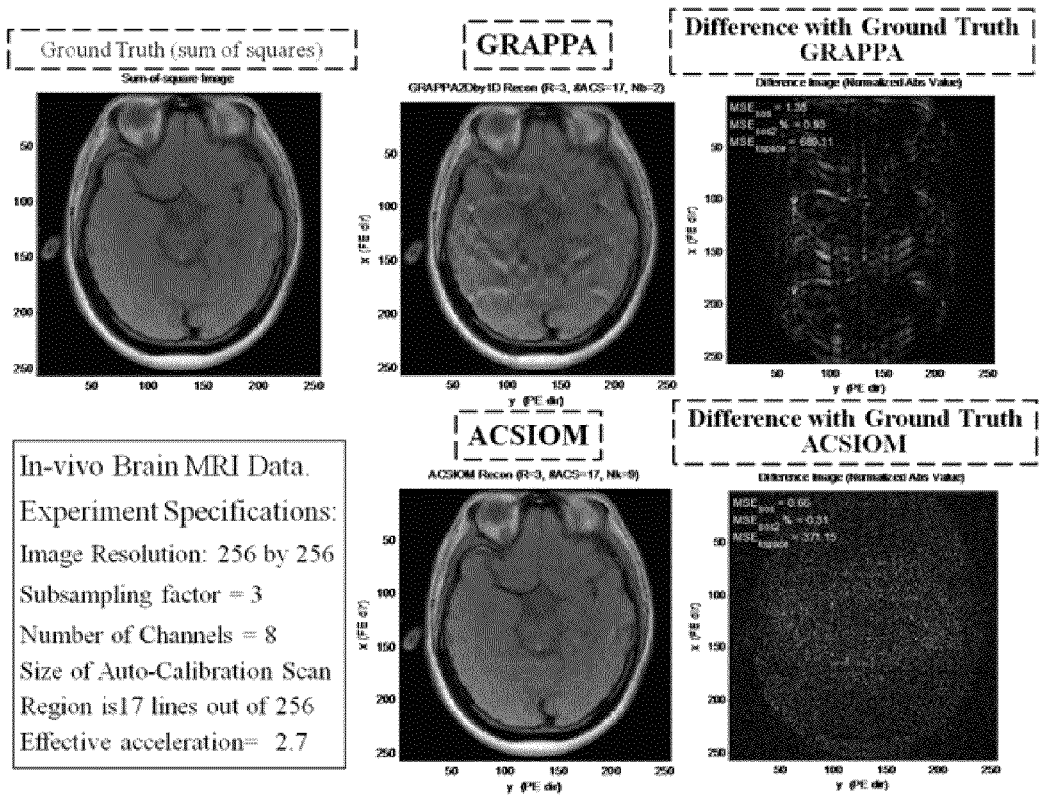
FIG. 11 shows the results of a brain imaging experiment comparing an image produced by the present invention to an image produced by the method of GRAPPA.

EXAMPLES OF IN-VIVO RESULTS: Referring particularly to FIG. 10 and FIG. 11, the images compare the results of reconstructing an in-vivo brain PMRI data set using the method described in the preferred embodiment (solution to Eq. (8) using no weighting for the 2-norms) and comparing the results to the method of GRAPPA as described by M. A. Griswold et al., Magn. Reson. Med., vol. 47, pp. 1202-1210, June 2002.

Referring to FIG. 10 and FIG. 11, both experiments correspond to PMRI systems with N=8 receiver channels, image resolution of 256 by 256, and an ACS region of 17 phase-encode lines centered at the k-space origin. The effective acceleration (relative to Nyquist Sampling) for both methods is therefore equal to 2.7. The image combination method is the root sum of squares. As can be seen in both FIGS. 10 and 11, the method of the present invention clearly outperforms GRAPPA for these experiments. Referring specifically to FIG. 11, the difference images shown on the right side suggest that the reconstruction error in GRAPPA is induced by aliasing and causes noticeable coherent distortions, therefore significantly reducing the diagnostic quality of the image; whereas the ACSIOM-reconstructed image only exhibits low-energy noise-like (incoherent) distortion, while preserving the important edge and structural information.

The invention claimed is:

1. A method for acquiring and producing images of a subject with a magnetic resonance imaging (MRI) system equipped with a plurality of receiver coils, the method comprising the steps of:
    (a) acquiring a plurality of MR data sets in k-space from at least two of said receiver coils;
    (b) computing at least one interpolation kernel that optimizes a cost function comprising:
        (i) a measure of data consistency; and
        (ii) a measure of predicted image distortions corresponding to aliasing effects;
        with both measures computed with respect to at least one of said MR data sets acquired in step (a);
    (c) performing interpolation of said MR data sets from step (a) using said one or more interpolation kernels from step (b) in k-space or via point-by-point multiplication in image space; and
    (d) reconstructing a plurality of images from the interpolated data sets produced in step (c).

2. The method as recited in claim 1, wherein the acquired k-space data sets may include auto-calibration scan (ACS) data sets according to the method of GRAPPA or other coil calibration data.

3. The method as recited in claim 2 wherein step (c) or step (d) also utilize at least one sample value of said ACS or coil calibration data.

4. The method as recited in claim 1, wherein each acquired data set in step (a) is sampled on a Cartesian k-space trajectory.

5. The method as recited in claim 1, wherein the spacing of data samples in at least one of the data sets acquired in step (a) is subsampled with respect to the Nyquist sampling criterion for a prescribed field-of-view (FOV); and the intermediate data sets synthesized in step (c) correspond to a plurality of data sets that are Nyquist-sampled with respect to said prescribed FOV.

6. The method as recited in claim 1 wherein an estimate of receiver coil noise characteristics or correlation of noise among the receiver coils is utilized in computation of the interpolation kernel in step (b) or computations in steps (c) or (d).

7. The method as recited in claim 1, further comprising the step of combining the plurality of images reconstructed in step (d) into a composite image.

8. A method for acquiring and producing images of a subject with a MRI system equipped with a plurality of receiver coils, the method comprising the steps of:
    (a) acquiring a plurality of MR data sets in k-space from at least two of said receiver coils;
    (b) identifying at least one multi-input filter bank that is comprised of a plurality of finite impulse response (FIR) filters and optimizes a cost function comprising:
        (i) a measure of data consistency; and
        (ii) a measure of predicted image distortions corresponding to aliasing effects;
        with both measures computed with respect to at least one of said MR data sets;
    (c) synthesizing at least one intermediate data set from said MR data sets from step (a) using said filter banks from step (b); and
    (d) reconstructing at least one image from the intermediate data sets synthesized in step (c).

9. The method as recited in claim 8, wherein said intermediate data sets in step (c) are computed as outputs of said filter bank with inputs comprising said MR data sets from step (a).

10. The method as recited in claim 8, wherein the acquired k-space data sets may include auto-calibration scan (ACS) data sets according to the method of GRAPPA or other coil calibration data.

11. The method as recited in claim 10 wherein step (c) or step (d) also utilize at least one sample value of said ACS or coil calibration data.

12. The method as recited in claim 8, wherein each acquired data set in step (a) is sampled on a Cartesian k-space trajectory.

13. The method as recited in claim 8, wherein the spacing of data samples in at least one of the data sets acquired in step (a) is subsampled with respect to the Nyquist sampling criterion for a prescribed field-of-view (FOV); and the intermediate data sets synthesized in step (c) correspond to a plurality of data sets that are Nyquist-sampled with respect to said prescribed FOV.

14. The method as recited in claim 8, wherein an estimate of receiver coil noise characteristics or correlation of noise among the receiver coils is utilized in identification of the multi-input filter bank in step (b) or computations in steps (c) or (d).

15. The method of as recited in claim 8, further comprising the step of combining the plurality of images reconstructed in step (d) into a composite image.

16. The method as recited in claim 8, wherein each of the k-space data sets in step (a) is acquired by two-dimensional Cartesian acquisition and the computation in step (c) is performed using discrete Fourier transform operators in the image space or in a hybrid space.

17. A method for acquiring and producing images of a subject with a MRI system equipped with a plurality of receiver coils, the method comprising the steps of:
(a) acquiring a plurality of MR data sets in k-space from at least two of said receiver coils;
(b) identifying at least one multi-input filter bank that is comprised of a plurality of shift-invariant filters and optimizes a cost function comprising:
  (i) a measure of data consistency; and
  (ii) a measure of predicted image distortions corresponding to aliasing effects;
  with both measures computed with respect to at least one of said MR data sets;
(c) synthesizing at least one intermediate data set from said MR data sets from step (a) using said filter banks from step (b); and
(d) reconstructing at least one image from the intermediate data sets synthesized in step (c).

18. The method as recited in claim 17, wherein said intermediate data sets in step (c) are computed as outputs of said filter bank with inputs comprising said MR data sets from step (a).

19. The method as recited in claim 17, wherein the acquired k-space data sets may include auto-calibration scan (ACS) data sets according to the method of GRAPPA or other coil calibration data.

20. The method as recited in claim 19, wherein step (c) or step (d) also utilize at least one sample value of said ACS or coil calibration data.

21. The method as recited in claim 17, wherein each acquired data set in step (a) is sampled on a Cartesian k-space trajectory.

22. The method as recited in claims 17, wherein the spacing of data samples in at least one of the data sets acquired in step (a) corresponds to subsampling with respect to the Nyquist sampling criterion for a prescribed field-of-view (FOV); and the intermediate data sets synthesized in step (c) correspond to a plurality of data sets that are Nyquist-sampled with respect to said prescribed FOV.

23. The method as recited in claim 17, wherein an estimate of receiver coil noise characteristics or correlation of noise among the receiver coils is utilized in identification of the multi-input filter bank in step (b) or computations in steps (c) or (d).

24. The method of as recited in claim 17 further comprising the step of combining the plurality of images reconstructed in step (d) into a composite image.

25. The method as recited in claim 17, wherein each of the k-space data sets in step (a) is acquired by two-dimensional Cartesian acquisition and the computation in step (c) is performed using discrete Fourier transform operators in the image space or in a hybrid space.

26. The method as recited in claim 17, in which said measures of data consistency and predicted image distortion in step (b) are computed as functions of the discrepancy of the left and right hand sides of the "blind PI relations."

27. The method as recited in claim 17, wherein said multi input filter bank consists of FIR filters and said cost function is the "ACSIOM cost function" or any version thereof corresponding to linear transformations of the arguments.

* * * * *

UNITED STATES PATENT AND TRADEMARK OFFICE
CERTIFICATE OF CORRECTION

PATENT NO.         : 8,831,318 B2
APPLICATION NO.    : 12/827588
DATED              : September 9, 2014
INVENTOR(S)        : Sharif et al.

Page 1 of 1

It is certified that error appears in the above-identified patent and that said Letters Patent is hereby corrected as shown below:

On the Title Page

Item [75] Inventors: "Yoem" should be -- 'Yoram --.

Signed and Sealed this
Eleventh Day of November, 2014

Michelle K. Lee
*Deputy Director of the United States Patent and Trademark Office*